(12) United States Patent
Hung et al.

(10) Patent No.: US 11,630,155 B2
(45) Date of Patent: Apr. 18, 2023

(54) KEYBOARD WITH WIRE AGING SELF-ADAPTATION, SELF-ADAPTATION METHOD FOR KEYBOARD, ELECTRONIC COMPUTING DEVICE READABLE MEDIUM WITH STORED PROGRAM, AND ELECTRONIC COMPUTING DEVICE PROGRAM PRODUCT

(71) Applicant: Chicony Electronics Co., Ltd., New Taipei (TW)

(72) Inventors: Wei-Tse Hung, New Taipei (TW); Chien-Tsung Chen, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 17/502,612

(22) Filed: Oct. 15, 2021

(65) Prior Publication Data
US 2022/0381827 A1     Dec. 1, 2022

(30) Foreign Application Priority Data
May 27, 2021    (TW) .................................. 110119316

(51) Int. Cl.
*G01R 31/327*     (2006.01)
*G01R 31/28*     (2006.01)

(52) U.S. Cl.
CPC ..... *G01R 31/3277* (2013.01); *G01R 31/2843* (2013.01)

(58) Field of Classification Search
CPC .......... G01R 31/2843; G01R 31/3277; H03M 11/12; H03M 11/14; H03M 11/16; H03M 11/18; H03M 11/20; G06F 3/0238; G06F 11/2221
See application file for complete search history.

(56) References Cited

U.S. PATENT DOCUMENTS

| | | | | |
|---|---|---|---|---|
| 3,918,051 | A * | 11/1975 | Bernin .................... | H03M 11/20 341/25 |
| 3,978,474 | A * | 8/1976 | Engstrom .............. | H03M 11/20 365/62 |
| 4,644,841 | A * | 2/1987 | Nagashima ............ | G10H 1/181 984/332 |
| 9,876,510 | B2 * | 1/2018 | Heldeis .................. | H03M 11/20 |

(Continued)

*Primary Examiner* — Thang X Le
(74) *Attorney, Agent, or Firm* — Muncy, Geissler, Olds & Lowe, P.C.

(57) ABSTRACT

A keyboard with wire aging self-adaption, a self-adaption method for keyboard, an electronic computing device readable medium with a stored program, and an electronic computing device program product are provided. In the keyboard, a processor feeds a scanning signal to each scanning line in turn during a scanning round. In response to the conduction state of one of switching elements, the processor detects a return signal on the corresponding return line and selects one or more scanning lines as a testing line. During a first duration in which the testing line maintains the scanning signal, according to the time difference between the starting points of the first duration and the return signal and the response time parameter corresponding to the testing line that is stored in the memory, the processor determines whether to update the response time parameter corresponding to the testing line that is stored in the memory.

22 Claims, 5 Drawing Sheets

(56) References Cited

U.S. PATENT DOCUMENTS

| | | | |
|---|---|---|---|
| 2006/0049965 A1* | 3/2006 | Laliberte | H03K 5/1254 |
| | | | 341/24 |
| 2008/0079611 A1* | 4/2008 | Togashi | H03M 11/20 |
| | | | 341/26 |
| 2008/0111712 A1* | 5/2008 | Himpe | H03M 11/20 |
| | | | 341/26 |
| 2012/0262376 A1* | 10/2012 | Li | H03M 11/20 |
| | | | 345/168 |

* cited by examiner

KEYBOARD WITH WIRE AGING SELF-ADAPTATION, SELF-ADAPTATION METHOD FOR KEYBOARD, ELECTRONIC COMPUTING DEVICE READABLE MEDIUM WITH STORED PROGRAM, AND ELECTRONIC COMPUTING DEVICE PROGRAM PRODUCT

CROSS-REFERENCE TO RELATED APPLICATION

This non-provisional application claims priority under 35 U.S.C. § 119(a) to Patent Application No. 110119316 filed in Taiwan, R.O.C. on May 27, 2021, the entire contents of which are hereby incorporated by reference.

BACKGROUND

Technical Field

The instant disclosure relates to keyboard scanning technologies, in particular, to a keyboard with wire aging self-adaptation, a self-adaptation method for keyboard, and an electronic computing device readable medium with stored program as well as an electronic computing device program product related to the self-adaption method for keyboard.

Related Art

Computer keyboards are one of the essential human-machine interface input devices for personal computers; most computer keyboards use matrix type button switch circuits, which have the advantages of simple circuitry, fast operation, and low cost. At present, most of the matrix button switches are made by the printed circuit board assembly (PCBA) layout process or the membrane screen print process. In the wire of the circuit, the impedance of the wire, the parasitic capacitance of the wire, and the distributed capacitance exist.

SUMMARY

FIG. 1 illustrates a schematic view of a circuit of a matrix type button switch known to the inventor. Please refer to FIG. 1. The circuit 100 of the matrix type button switch generally includes a switching element SW, a scanning line 102, and a return line 101. The switching element SW is coupled to an intersection of the scanning line 102 and the return line 101.

The aforementioned impedance of the wire can be presented by the equivalent resistance Req, and the aforementioned parasitic capacitance and distributed capacitance can be presented by the equivalent capacitance Ceq.

The operation of the circuit 100 of the matrix type button switch known to the inventor is inputting a low voltage signal to the scanning line 102 in one scanning duration. If in the scanning duration, the switching element SW is pressed, the return line 101 and the scanning line 102 connected to the switching element SW are in a conduction state, and the low voltage signal inputted to the scanning line 102 is transmitted to the return line 101. Therefore, by detecting the potential of the return line 101, whether the switching element SW is pressed or not can be detected.

Please refer to FIG. 1 and FIG. 2. FIG. 2 illustrates a schematic graph 200 showing that the cross voltage $V_{Ceq}$ of the equivalent capacitance Ceq is in response to the pressed state of the switching element SW. In the duration 201 shown in FIG. 2, $V_{Ceq}$ maintains in the reference voltage Vcc. If the switching element SW is pressed in the scanning duration, then $V_{Ceq}$ starts decreasing. When the wire is aging, the equivalent resistance Req which represents the impedance of the wire and the equivalent capacitance Ceq which represents the parasitic capacitance and the distributed capacitance increase. The increased equivalent resistance Req and the increased equivalent capacitance Ceq cause the decrease duration 202 of $V_{Ceq}$ to increase, thereby interfering the voltage detection of the return line 101 in the scanning duration. As a result, errors in pressing detection of the switching element SW occur, thus reducing the accuracy in pressing detection of the switching element SW.

In view of this, in one or some embodiments of the present disclosure, a keyboard with wire aging self-adaption, a self-adaption method for keyboard, an electronic computing device readable medium with stored program, and an electronic computing device program product are provided to improve the current technical problem(s).

In one or some embodiments, a keyboard with wire aging self-adaption is provided. The keyboard with wire aging self-adaption comprises a scanning circuit. The scanning circuit comprises a plurality of scanning lines, a plurality of return lines, and a plurality of switching elements. The switching elements are respectively coupled to intersections of the scanning lines and the return lines. The keyboard with wire aging self-adaption further comprises a processor and a memory. The memory stores a plurality of response time parameters respectively corresponding to the scanning lines. The processor is coupled to the scanning circuit and the memory. In a scanning round, the processor feeds a scanning signal to each of the scanning lines in turn. In response to a conduction state of one of the switching elements, the processor detects a return signal on the corresponding return line, and the processor selects at least one of the scanning lines as a testing line. In a first duration in which the testing line maintains the scanning signal, the processor detects a starting point of the first duration to a starting point of the return signal corresponding to the first duration to obtain a time difference. According to the time difference and the response time parameter corresponding to the testing line that is stored in the memory, the processor determines whether or not to update the response time parameter corresponding to the testing line that is stored in the memory. The time length of the first duration is a first time period.

In one or some embodiments, a self-adaption method for keyboard is provided, and the method is executed by a processor. The keyboard comprises a scanning circuit. The scanning circuit comprises a plurality of scanning lines, a plurality of return lines, and a plurality of switching elements respectively coupled to intersections of the scanning lines and the return lines. The self-adaption method for keyboard comprises following steps: setting a parameter set, wherein the parameter set comprises a plurality of response time parameters of the scanning lines; selecting at least one of the scanning lines as a testing line in a scanning round; and feeding a scanning signal to each of the scanning lines in turn by the processor in the scanning round and detecting a return signal on the corresponding return line in response to a conduction state of one of the switching elements, wherein in a first duration in which the testing line maintains the scanning signal, the processor detects a starting point of the first duration to a starting point of the return signal corresponding to the first duration to obtain a time difference, and wherein according to the time difference and the response time parameter corresponding to the testing line that is stored in the memory, the processor determines whether or not to update the response time parameter corresponding to the testing line that is stored in the memory. The time length of the first duration is a first time period.

In one or some embodiments, an electronic computing device readable medium with a stored program and an electronic computing device program product are provided. When an electronic computing device with a processor loads and executes the stored program, the electronic computing device is capable of performing the self-adaption method for keyboard as mentioned above.

Based on the above, in the keyboard with wire aging self-adaption, the self-adaption method for keyboard, the electronic computing device readable medium with stored program, and the electronic computing device program product according to one or some embodiments of the instant disclosure, according to the time difference between the starting point of the first duration and the starting point of the return signal corresponding to the first duration and the response time parameter corresponding to the testing line that is stored in the memory, the processor determines whether or not to update the response time parameter corresponding to the testing line that is stored in the memory. Accordingly, the processor can feed the scanning signal to each of the scanning lines in a proper timing so as to improve the accuracy in pressing detection of the switching element. Moreover, when the wire of the keyboard is aging, the response time parameter can be updated correspondingly, so that the accuracy in pressing detection of the switching elements can be maintained and the wire aging can be self-adapted.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
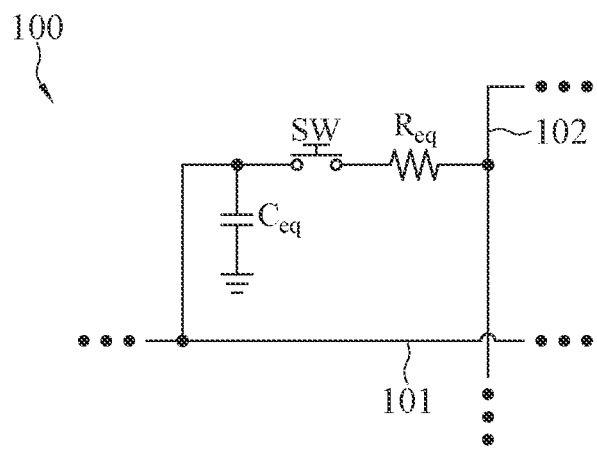
FIG. 1 illustrates a schematic view of a circuit of a matrix type button switch known to the inventor.

The foregoing and other technical contents, features, and effects of the instant disclosure will be clearly presented in the following detailed description of the embodiments with reference to the drawings. The thickness or dimensions of the components in the drawings are presented exaggeratedly, omittedly, or generally, for persons having ordinary skills in the art to understand and read, and the dimensions of each component are not exactly its actual dimensions, are not intended to limit the conditions under which the instant disclosure can be implemented, and do not have practical meaning in technical aspects. Any modification, change of proportion, or adjustment of size of the structure shall fall within the scope of the technical content of the instant disclosure as disclosed herein, provided that it does not affect the effect and purpose of the instant disclosure. In all the drawings, the same reference numbers are used to indicate the same or similar elements. The term "couple" or "connect" referred to in the following examples may refer to any direct or indirect manners of connection.

Figure 3:
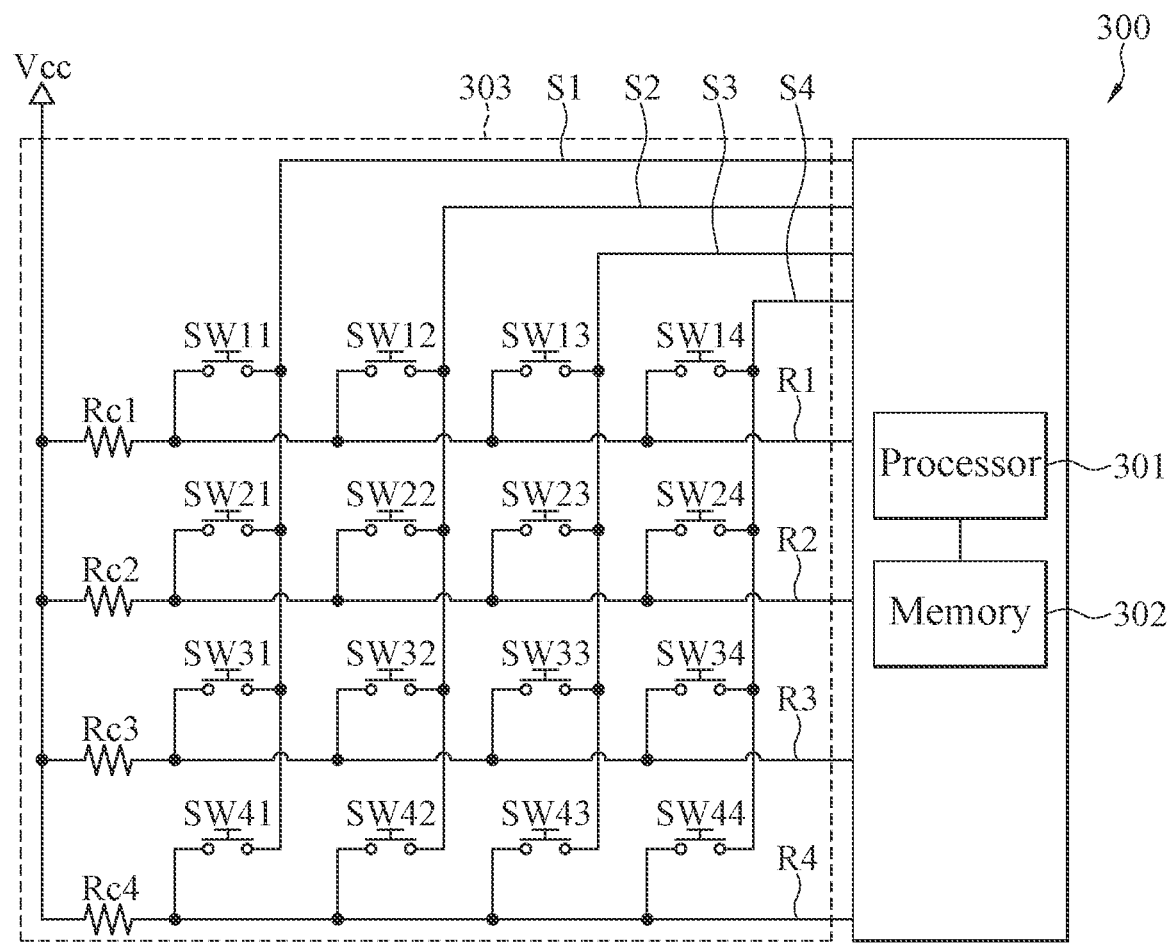
FIG. 3 illustrates a schematic view showing a keyboard circuit with wire aging self-adaption according to an exemplary embodiment of the instant disclosure.

FIG. 3 illustrates a schematic view showing a keyboard circuit with wire aging self-adaption according to an exemplary embodiment of the instant disclosure. Please refer to FIG. 3, and the keyboard circuit 300 with wire aging self-adaption comprises a scanning circuit 303, a processor 301, and a memory 302.

The scanning circuit 303 comprises N scanning lines, M return lines, and a plurality of switching elements, where the M and N are positive integers. For example, M may be five, and N may be four. For sake of illustration, in this embodiment, the N scanning lines are represented by four scanning lines S1-S4, and the M return lines are represented by four return lines R1-R4.

In this embodiment, a switching element is coupled to an intersection of each of the scanning lines and the corresponding return line. For example, a switching element SW11 is coupled to the intersection of the scanning line S1 and the return line R1, a switching element SW21 is coupled to the intersection of the scanning line S1 and the return line R2, a switching element SW12 is coupled to the intersection of the scanning line S2 and the return line R1, and so on.

In this embodiment, the scanning circuit 303 further comprises a plurality of reference resistors Rc1-Rc4 respectively coupled to the return lines R1-R4, such that the return lines R1-R4 are respectively connected to a reference voltage Vcc through the reference resistors Rc1-Rc4.

The memory 302 stores a plurality of response time parameters respectively corresponding to the scanning lines S1-S4. The processor 301 is coupled to the scanning circuit 303 and the memory 302. Detail descriptions of the self-adaption method for keyboard and the collaborations between the hardware of the keyboard circuit with wire aging self-adaption are provided along with drawings.

Figure 4:
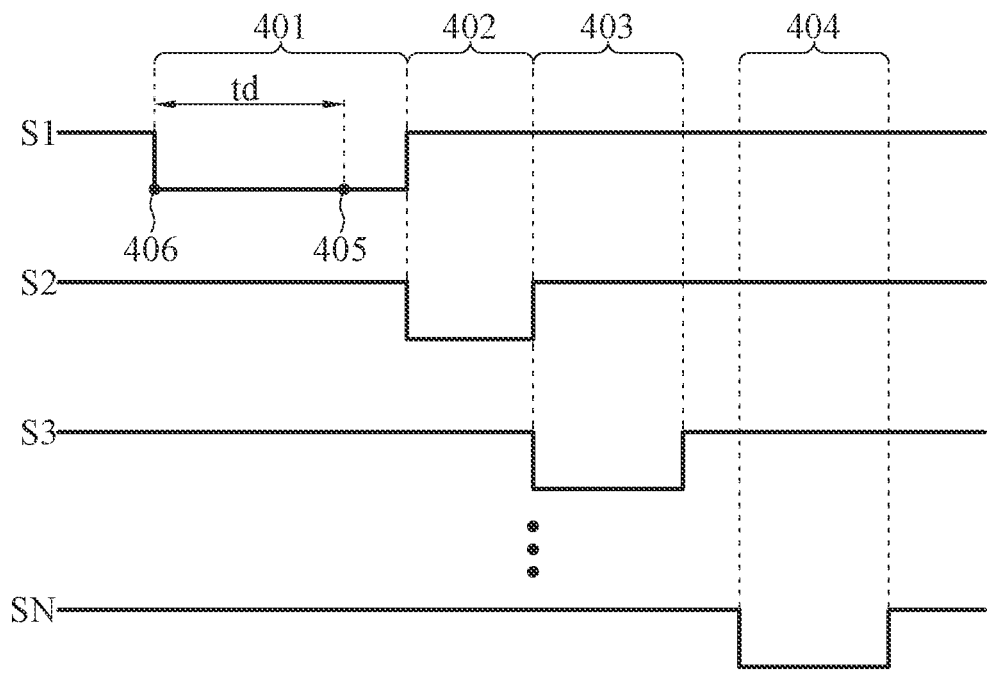
FIG. 4 illustrates a timing diagram of a scanning signal according to an exemplary embodiment of the instant disclosure.
Figure 6:
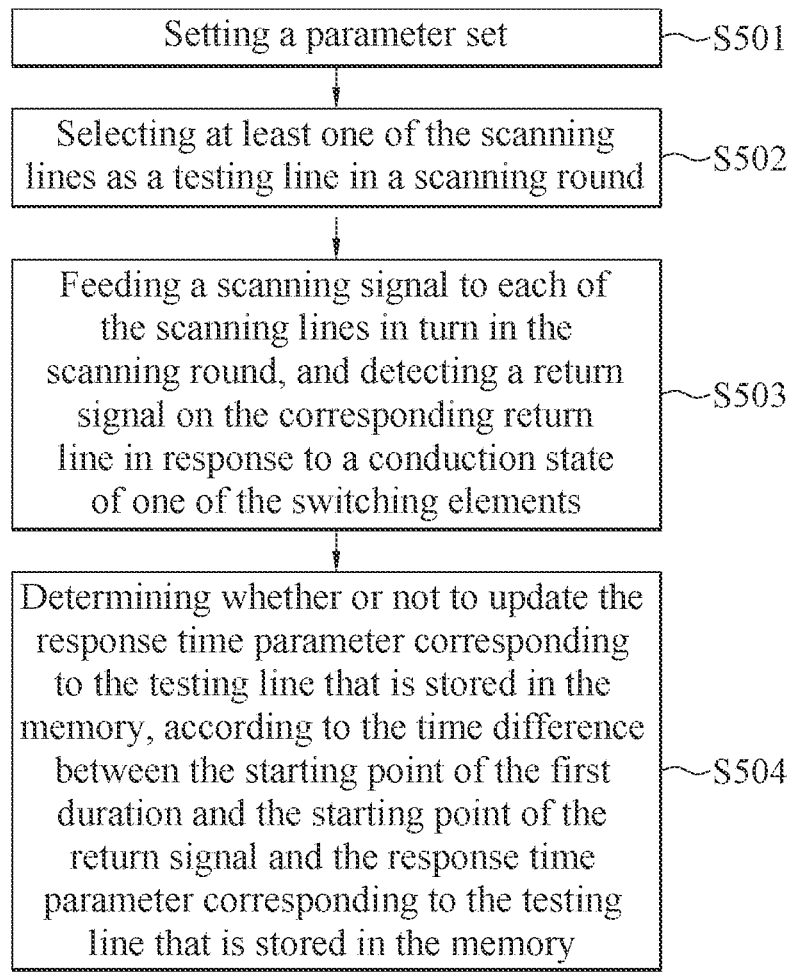
FIG. 6 illustrates a flowchart of a self-adaption method for keyboard according to an exemplary embodiment of the instant disclosure.

FIG. 4 illustrates a timing diagram of a scanning signal according to an exemplary embodiment of the instant disclosure. FIG. 6 illustrates a flowchart of a self-adaption method for keyboard according to an exemplary embodiment of the instant disclosure. Please refer to FIGS. 3, 4, and 6. As four scanning lines S1-S4 are used to present the N scanning lines, the reference number "SN" in FIG. 4 represents S4. As shown in FIG. 6, in the step S501, the processor 301 reads a plurality of response time parameters respectively corresponding to the scanning lines S1-S4 from the memory 302 to set a parameter set.

In order to prevent the wire aging of the keyboard which will affect the accuracy in pressing detection of the switching elements SW11-SW44, as shown in FIG. 6, in the step S502, in a scanning round, the processor 301 selects at least one of the scanning lines S1-S4 as a testing line. In the same scanning round, the remaining scanning lines that are not selected as the testing line are referred as non-testing lines.

In this embodiment, as an illustrative example, the scanning line S1 is selected as the testing line, and the scanning lines S2-S4 are non-testing lines.

In the step S503, in a scanning round, the processor 301 feeds a scanning signal to each of the scanning lines in turn, and in response to the conduction state of one of the switching elements, the processor 301 detects a return signal on the corresponding return line. For example, as shown in FIG. 4, the scanning interval 401 of the scanning line S1 which is served as the testing line maintains for a first duration. In other words, in this embodiment, in the first duration, the maintained duration of the scanning interval 401, the processor 301 inputs the scanning signal with low logic level to the scanning line S1. The scanning intervals 402-404 of the non-testing lines (in this embodiment, the scanning lines S2-S4) maintains for a second duration different from the first duration. In other words, in this embodiment, in the second duration, the maintained duration of the scanning intervals 402-404, the processor 301 inputs the scanning signal with low logic level to each of the scanning lines S2-S4 respectively.

The processor 301, respectively inputs the scanning signal with low logic level to the scanning lines S1-S4, in the scanning interval 401, the scanning interval 402, the scanning interval 403, and the scanning interval 404. When the switching element SW21 coupled to the intersection of the scanning line S1 and the return line R2 is pressed at a time point 405 within the scanning interval 401, and the processor 301 receives and detects the return signal with low logic level from the return line R2 corresponding to the switching element SW21.

Then, in the step S504, according to a time difference between the starting point of the first duration and the starting point of the return signal and the response time parameter corresponding to the testing line (the scanning line S1) that is stored in the memory 302, the processor 301 determines whether or not to update the response time parameter corresponding to the testing line that is stored in the memory 302. For example, as shown in FIG. 4, in the first duration (the scanning interval 401) in which the scanning signal with low logic level is inputted to the scanning line S1, when the processor 301 receives and detects the return signal at the time point 405, the processor 301 calculates a time difference td between the starting point of the first duration (namely, in this embodiment, the time point 406) and the starting point of the return signal corresponding to the first duration (namely, in this embodiment, the time point 405). Then, according to the time difference td and the response time parameter corresponding to the testing line (the scanning line S1) that is stored in the memory, the processor 301 determines whether or not to update the response time parameter corresponding to the testing line (the scanning line S1) that is stored in the memory 302.

In a condition that the processor 301 does not receive and detect the return signal in the first duration (the scanning interval 401) in which the scanning signal with low logic level is inputted to the testing line (the scanning line S1), that is, in this embodiment, the switching elements SW11, SW21, SW31, SW4 coupled to the scanning line S1 are not pressed and/or triggered in the first duration (the scanning interval 401) of the scanning line S1, after the first duration, the processor 301 will take at least one of the non-testing lines (the scanning lines S2-SN) as the testing line in the next scanning round and execute the next scanning round with the foregoing steps. In each of the scanning cycles, the processor 301 feeds the scanning signal to each of the scanning lines S1-S4 in turn, and the processor 301 selects each of the scanning lines S1-S4 as the testing line to execute a scanning round in turn. In general, the scanning rounds cycle continuously, so that the processor 301 can detect that the switching element is pressed. When each of the scanning lines S1-S4 is selected as the testing line and the current scanning round is completed, one scanning cycle is finished.

Figure 5:
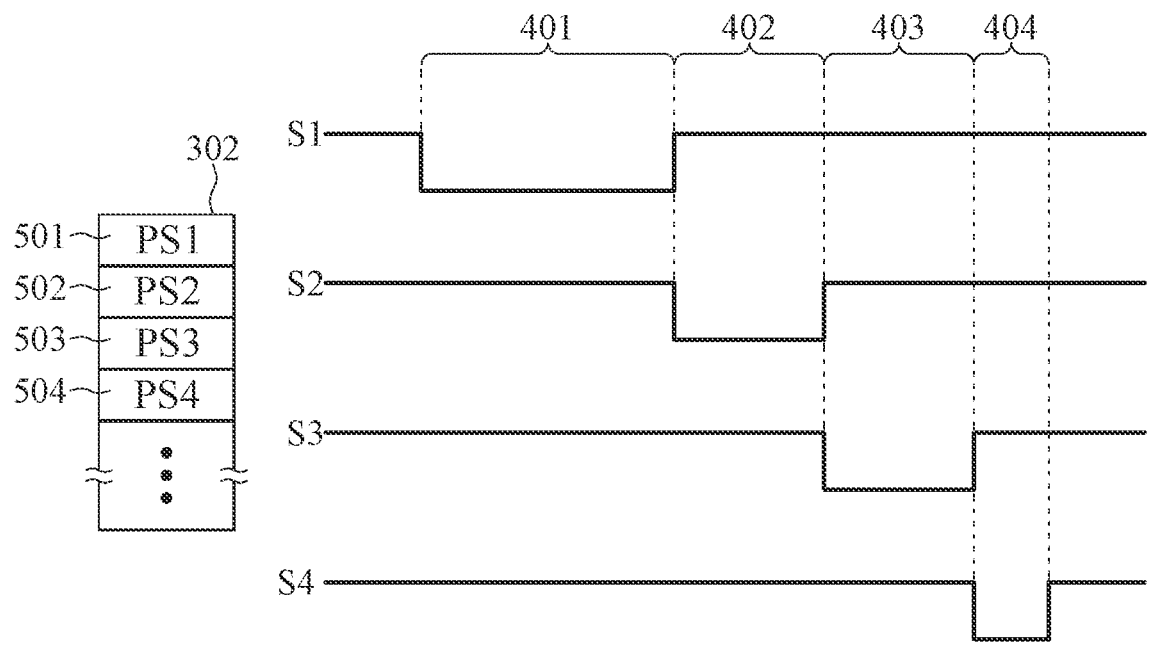
FIG. 5 illustrates a schematic view showing the correspondence between scanning time sequences and response time parameters of scanning lines according to the exemplary embodiment of the instant disclosure.

FIG. 5 illustrates a schematic view showing the correspondence between scanning time sequences and response time parameters of the scanning lines according to an exemplary embodiment of the instant disclosure. Please refer to FIGS. 3 to 6. In this embodiment, the memory location 501 of the memory 302 stores the response time parameter PS1 corresponding to the scanning line S1, the memory location 502 of the memory 302 stores the response time parameter PS2 corresponding to the scanning line S2, the memory location 503 of the memory 302 stores the response time parameter PS3 corresponding to the scanning line S3, and the memory location 504 of the memory 302 stores the response time parameter PS4 corresponding to the scanning line S4. For example, if the processor 301 selects the scanning line S1 as the testing line, the processor 301 inputs the scanning signal with low logic level to the scanning line S1 and maintains the scanning signal for a first time period; that is, in this embodiment, the time length of the first duration is the first time period. Furthermore, in this embodiment, the scanning lines S2-S4 are non-testing lines, and the processor 301 inputs the scanning signal with low logic level to the scanning lines S2-S4 and respectively maintains the scanning signal for a second time period; that is, in this embodiment, the time length of the second duration is the second time period.

The processor 301 determines the first time period and the second time period according to the response time parameters (in this embodiment, PS1-PS4) respectively corresponding to the scanning lines S1-S4 that are stored in the memory 302. For example, when the testing line is the scanning line S1, the first time period may be several times (for example, three times, ten times, or twenty times) of the response time parameter PS1 of the scanning line S1. It is understood that, in the instant disclosure, the relationship between the first time period and the response time parameter PS1 are not limited to the multiple relationship abovementioned. In some embodiment, the first time period may be a specific function of the response time parameter PS1 of the scanning line S1. The relationship between the first time period and the response time parameter PS1 of the scanning line S1 may be designed as long as the first time period is greater than or equal to an allowable range of the response time parameter corresponding to the testing line that is stored in the memory 302, such that in the first duration, the processor 301 can detect the return signal upon the switching element coupled to the testing line is pressed.

Regarding the non-testing lines (the scanning lines S2-S4), the processor 301 respectively takes the response time parameters PS2-PS4 corresponding to the non-testing lines (the scanning lines S2-S4) that are stored in the memory 302 as a second time period in which the scanning signal is maintained in each of the scanning lines S2-S4.

Specifically, in this embodiment, regarding the scanning lines S2-S4 which are taken as the non-testing lines, the second time period of the scanning line S2 may be the response time parameter PS2, the second time period of the scanning line S3 may be the response time parameter PS3, and the second time period of the scanning line S4 may be the response time parameter PS4.

In this embodiment, the processor 301 takes a multiple of the response time parameter corresponding to a scanning line (the testing line) that is stored in the memory 302 as the first time period, and the processor 301 directly takes the response time parameter corresponding to one of the other scanning lines (the non-testing line) that is stored in the memory 302 as the second time period. For example, the response time parameters PS1-PS4 respectively corresponding to the scanning lines S1-S4 are all 30 microseconds (μs), the scanning line S1 is the testing line, and the scanning lines S2-S4 are non-testing lines. The first time period corresponding to the testing line (the scanning line S1) may be 600 μs (i.e. twenty times of the response time parameter PS1), and the second time period corresponding to the non-testing lines (the scanning lines S2-S4) may be 30 μs. For another example, the response time parameter PS1 is 30 μs, the response time parameter PS2 is 40 μs, the response time parameter PS3 is 35 μs, and the response time parameter PS4 is 50 μs. The first time period may be 600 μs (twenty times of the response time parameter PS1), the second time period of the scanning line S2 is 40 μs, the second time period of the scanning line S3 is 35 μs, and the second time period of the scanning line S4 is 50 μs.

In some embodiments, the processor 301 takes the response time parameter stored in the memory 302 as a basis to plus a tolerance value as the second time period. For example, the response time parameter PS1 is 30 μs, the response time parameter PS2 is 40 μs, the response time parameter PS3 is 35 μs, and the response time parameter PS4 is 50 μs. The first time period is 600 μs (twenty times of the response time parameter PS1), the second time period of the scanning line S2 is 60 μs, the second time period of the scanning line S3 is 53 μs, and the second time period of the scanning line S4 is 75 μs.

It should be noted that, in some embodiments, the processor 301 inputs the low logic level signal to the scanning lines S1-S4 and reads the return signal which indicates that the voltage of the return line R2 is in low logic level, but embodiments of the instant disclosure are not limited thereto. In some embodiments, the circuit shown in FIG. 3 may be modified to allow the processor 301 to input a high logic level signal to the scanning lines S1-S4 and reads the return signal which indicates that the voltage of the return line R2 is in high logic level (same as the logic level of the input signal).

In one or some embodiments of the instant disclosure, in order to allow all the scanning lines S1-S4 to execute the updating procedure for preventing from aging, the processor 301 executes several times of scanning rounds in one scanning cycle, and in each of the scanning rounds of the scanning cycle, the scanning lines selected as the testing line are different from each other. For example, the scanning line S1 is selected as the testing line in the first scanning round, the scanning line S2 is selected as the testing line in the second scanning round, and so on. It should be noted that, in some embodiments, the testing line may be selected without following the order of the scanning lines S1-S4; the scanning lines S1-S4 may be selected in the order of S2, S4, S1, S3 or selected freely, as long as all the scanning lines can be selected as the testing line in one scanning cycle.

Aging of the keyboard always exists, and such condition becomes serious as time goes by. Taking the keyboard circuit 300 shown in FIG. 3 as an example, the scanning circuit 303 comprises four scanning lines S1-S4. If the processor 301 is made to scan each of the scanning lines (the testing line and the non-testing lines) for a longer fixed time (for example, 600 μs) for preventing wire aging of the keyboard, one scanning round takes 2400 μs (4×600 μs=2400 μs). In one or some embodiments of the instant disclosure, the processor 301 takes a multiple of the response time parameter corresponding to the testing line that is stored in the memory 302 as the scanning time (the first time period) of the testing line, and the processor 301 directly takes the response time parameters respectively corresponding to the non-testing lines that are stored in the memory 302 as the scanning time (the second time period). Regarding the example in the foregoing embodiments, the response time parameter PS1 corresponding to the testing line (the scanning line S1) is 30 μs, and the response time parameters PS2, PS3, PS4 corresponding to the non-testing lines (the scanning lines S2-S4) are 40 μs, 35 μs, and 50 μs, respectively. The first time period of the testing line may be twenty times of the response time parameter PS1 (600 μs), and the second time periods of the non-testing lines may be the corresponding response time parameters PS2, PS3, PS4, respectively (i.e. 40 μs, 35 μs, and 50 μs, respectively). In this embodiment, it takes just 725 μs (600 μs+40 μs+35 μs+50 μs=725 μs) to complete one scanning round. Hence, according to one or some embodiments of the instant disclosure, the time for completing one scanning round can be reduced and the response time of the switching element can be improved.

Figure 2:
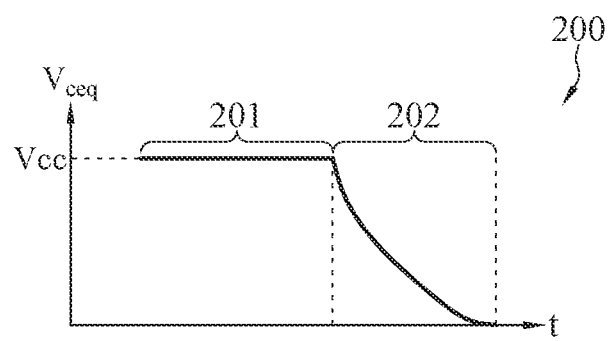
FIG. 2 illustrates a schematic graph known to the inventor showing that the cross voltage of the equivalent capacitance is in response to the pressed state of the switching element.

Moreover, when the wire of the keyboard is aging to a certain extent, even if the scanning line is scanned for a longer fixed time, the issue of the pressing detection error of the switching elements SW illustrated in FIGS. 1 and 2 still occurs. In one embodiment of the instant disclosure, since the response time parameter of the scanning line varies along with the aging of the wire of the keyboard, the first time period is selected as a multiple (e.g., three times) of the response time of the scanning line. Hence, the continuous aging of the wire of the keyboard can be overcome.

In one embodiment of the instant disclosure, after the processor 301 compares the time difference td with the response time parameter corresponding to the testing line that is stored in the memory 302, in the condition that the time difference td is greater than the response time parameter corresponding to the testing line, the processor 301 has to update the response time parameter corresponding to the testing line that is stored in the memory 302. Such condition indicates that the testing line is aging, and it can be reasonably considered that other scanning lines may be aged as well with a certain probability. Hence, in the subsequent scanning rounds, the processor 301 can select at least two of the scanning lines as the testing lines, until the scanning lines not being selected as the testing lines are selected as the testing line in the scanning cycle, thus accelerating the aging detection of the testing line.

For example, as shown in FIG. 4, in a certain scanning round, the processor 301 selects the scanning line S1 as the testing line. In the first duration, the processor 301 reads the return signal at the time point 405, then the processor 301 calculates a time difference td between the starting point (the time point 406) of the first duration (in this embodiment, the scanning interval 401) and the starting point (the time point 405) of the return signal corresponding to the first duration. Next, according to the time difference td and the response time parameter PS1 corresponding to the testing line (the scanning line S1) that is stored in the memory 302, the processor 301 determines whether or not to update the response time parameter PS1 corresponding to the testing line (the scanning line S1) that is stored in the memory 302. If the processor 301 determines that the response time parameter PS1 of the testing line S1 has to be updated, it is indicated that the scanning line S1 is aging. Hence, in the beginning of the next scanning round, the processor 301 selects two scanning lines different from the scanning line S1 (for example, the scanning lines S2, S3) as the testing lines, and the processor 301 respectively inputs the scanning signal with low logic level to the scanning line S2 by a time period greater than the response time parameter PS2 and inputs the scanning signal with low logic level to the scanning line S3 by a time period greater than the response time parameter PS3 to determine whether or not to update the response time parameters PS2, PS3 of the testing lines (the scanning lines S2, S3), so that whether the testing lines are aging or not can be checked. Regarding descriptions about how to determine whether or not to update the response time parameters PS2, PS3 of the testing lines (the scanning lines S2, S3) are provided as above and are not repeated.

Figure 7:
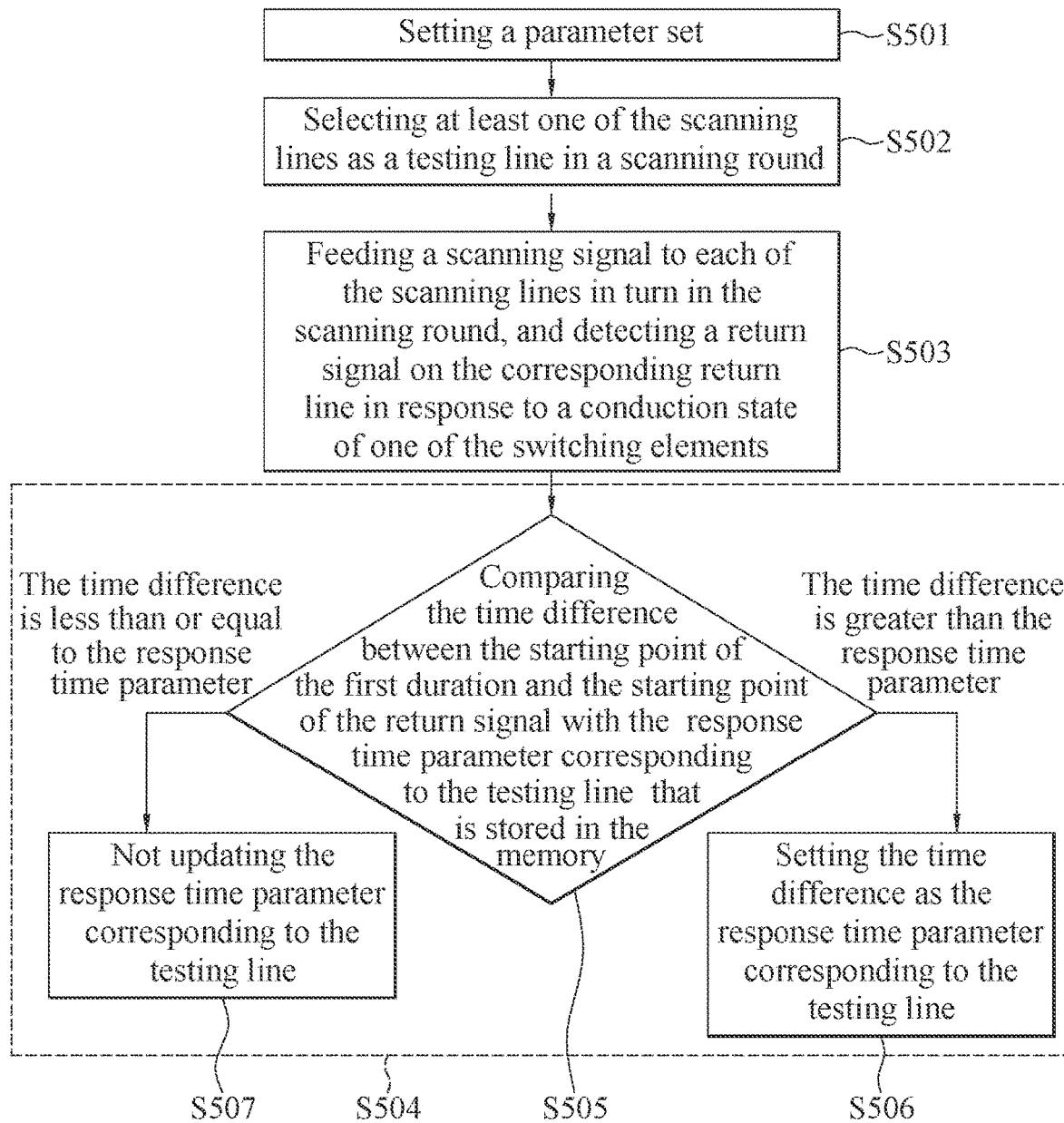
FIG. 7 illustrates a flowchart of a self-adaption method for keyboard according to an exemplary embodiment of the instant disclosure.

FIG. 7 illustrates a flowchart of a self-adaption method for keyboard according to an exemplary embodiment of the instant disclosure. Please refer to FIGS. 3-7, in this embodiment, the step S504 shown in FIG. 6 is implemented by the steps S505-S507. The steps S501-S503 in FIG. 7 are the same as the steps S501-S503 shown in FIG. 6, so it is unnecessary to go into details again. After the step S503, that is, in this embodiment, after the step of feeding a scanning signal to each of the scanning lines in turn, and detecting a return signal on the corresponding return line in response to the conduction state of one of the switching elements, the step S505 is executed. In the step S505, the processor 301 compares the time difference td between the starting point (the time point 406) of the first duration and the starting point (the time point 405) of the return signal corresponding to the first duration with the response time parameter corresponding to the testing line that is stored in the memory 302. In other words, in this embodiment, the processor 301 calculates the time difference td between the starting point (the time point 406) of the first duration and the starting point (the time point 405) of the return signal corresponding to the first duration, and then compares the time difference td with the response time parameter corresponding to the testing line. In the condition that the time difference td is greater than the response time parameter corresponding to the testing line, the processor 301 executes the step S506. In the step S506, the processor 301 sets the time difference td as the response time parameter corresponding to the testing line; that is, in this embodiment, the processor 301 updates the response time parameter corresponding to the testing line that is stored in the memory 302, so that the response time parameter corresponding to the testing line is set as the time difference. In the condition that the time difference is less than or equal to the response time parameter corresponding to the testing line, the processor 301 executes the step S507. In the step S507, the processor 301 does not update the response time parameter corresponding to the testing line that is stored in the memory 302.

In one or some embodiments of the instant disclosure, the processor 301 can compare the relationship between the time difference td and the response time parameter corresponding to the testing line that is stored in the memory 302, so that the processor 301 can further determine whether wire aging occurs or not and the processor 301 can determine whether or not to update the response time parameter corresponding to the testing line that is stored in the memory 302.

For example, it is supposed that the processor 301 selects the scanning line S1 as the testing line. After the processor 301 obtains the time difference td according to the foregoing steps, the processor 301 compares the time difference td and the response time parameter PS1 corresponding to the scanning line S1 that is stored in the memory 302 (the step S505). In the condition that the processor 301 determines that the time difference td is greater than the response time parameter PS1 of the testing line (the scanning line S1), the testing line (the scanning line S1) may be considered to have wire aging. Then, the processor 301 writes the time difference td into the memory location 501 of the memory 302 so as to update the response time parameter PS1 corresponding to the scanning line S1.

In the condition that the time difference td is greater than the response time parameter stored in the memory 302, the processor 301 sets the time difference td as the response time parameter corresponding to the testing line. It should be noted that, in other embodiments, by performing the certain mathematical calculations to the time difference td and the response time parameter stored in the memory 302 and then comparing the calculated results, the processor 301 determines whether or not to update the response time parameter corresponding to the testing line that is stored in the memory 302.

In some embodiments of the instant disclosure, after the processor 301 executes the step S505, in the condition that the time difference td is greater than the response time parameter of the testing line, the processor 301 updates the response time parameter corresponding to the testing line with a multiple (e.g., three times) of the time difference td, or the processor 301 updates the response time parameter corresponding to the testing line with a function (e.g., a linear function) of the time difference td.

In one embodiment of the instant disclosure, the processor 301 can upload the response time parameters corresponding to the scanning lines that are stored in the memory 302 to a personal computer (PC) or any computing device, so that the personal computer or the computing device can diagnose the aging condition of the wire of the keyboard according to the value of the response time parameters corresponding to the scanning lines. In some embodiments, the processor 301 may further calculate the update frequency of the response time parameter corresponding to each of the scanning lines in a certain time period and calculate the change rate of response time parameter to time, so that the personal computer or the computing device can diagnose the aging rate for each of the scanning lines.

In one embodiment of the instant disclosure, when the keyboard is kept unpressed for a period of time, the processor 301 may firstly stop the selecting procedure in which the testing line is selected to detect the aging of the testing line. Then, the processor 301 detects the conduction states of the switching elements in advance, and the processor 301 starts the scanning round in response to the conduction of any of the switching elements; however, it should be noted that, embodiments are not limited thereto. In some embodiments, the keyboard may determine the time point for stopping or for restarting the foregoing selecting procedure in which the testing line is selected to detect the aging of the testing line, by interruption or polling.

The term "electronic computing device readable medium" is commonly used to indicate a non-volatile non-transitory medium, such as a read only memory (ROM), a flash memory, a soft disk, a hard disk, a compact disk (CD), a digital versatile disc (DVD), a flash disk, an internet-accessible database, or other storage media with same functions. The electronic computing device readable medium can be used to carry one or several sequences of one or several instructions to the processor for execution. These instructions that are embodied on the media are usually referred as "electronic computing device program code" or "electronic computing device program product", and the "electronic computing device program code" or the "electronic computing device program product" may be a file capable of being transmitted on the internet and may be stored in non-transitory electronic computing device readable storage medium. Upon execution, these instructions allow the processor 301 to execute the steps or functions as described in one or some embodiments of the instant disclosure.

Based on the above, in the keyboard with wire aging self-adaption, the self-adaption method for keyboard, the electronic computing device readable medium with stored program, and the electronic computing device program product according to one or some embodiments of the instant disclosure, the processor detects the starting point (the time point 406 shown in FIG. 4) of the first duration and the starting point (the time point 405 shown in FIG. 4) of the return signal corresponding to the first duration to obtain the time difference. According to the time difference and the response time parameter corresponding to the testing line that is stored in the memory, the processor determines whether or not to update the response time parameter corresponding to the testing line that is stored in the memory. Accordingly, the processor can feed the scanning signal to each of the scanning lines in a proper timing so as to improve the accuracy in pressing detection of the switching element. Moreover, when the wire of the keyboard is aging, the response time parameter can be updated correspondingly, so that the accuracy in pressing detection of the switching elements can be maintained and the button response time can be improved. Furthermore, in one or some embodiments, the processor uploads the response time parameters corresponding to the scanning lines that are stored in the memory, the update frequency of the response time parameter corresponding to each of the scanning lines in a certain time period, and the change rate of response time parameter to time to a personal computer or any computing device, so that the aging extent and the aging rate of each of the scanning lines can be diagnosed.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A keyboard with wire aging self-adaption, comprising:
   a scanning circuit comprising a plurality of scanning lines, a plurality of return lines, and a plurality of switching elements, wherein the switching elements are respectively coupled to intersections of the scanning lines and the return lines;
   a memory storing a plurality of response time parameters respectively corresponding to the scanning lines; and
   a processor coupled to the scanning circuit and the memory, wherein in a scanning round, the processor feeds a scanning signal to each of the scanning lines in turn, the processor selects at least one of the scanning lines as a testing line, and in response to a conduction state of one of the switching elements coupled to the testing line, the processor detects a return signal on the return line corresponding to said switching element; in a first duration in which the testing line maintains the scanning signal, the processor detects a starting point of the first duration to a starting point of the return signal corresponding to the first duration to obtain a time difference, and according to the time difference and the response time parameter corresponding to the testing line that is stored in the memory, the processor determines whether or not to update the response time parameter corresponding to the testing line that is stored in the memory.

2. The keyboard with wire aging self-adaption according to claim 1, wherein in a condition that the time difference is greater than the response time parameter corresponding to the testing line that is stored in the memory, the processor updates the response time parameter corresponding to the testing line that is stored in the memory with the time difference.

3. The keyboard with wire aging self-adaption according to claim 2, wherein the processor selects at least two of the scanning lines as the testing lines to execute subsequent scanning rounds, until the scanning lines not being selected as the testing lines are selected as the testing line in a scanning cycle.

4. The keyboard with wire aging self-adaption according to claim 1, wherein in a condition that the time difference is less than or equal to the response time parameter corresponding to the testing line that is stored in the memory, the processor does not update the response time parameter corresponding to the testing line that is stored in the memory.

5. The keyboard with wire aging self-adaption according to claim 1, wherein the scanning lines comprise the testing line and a plurality of non-testing lines, the processor maintains the scanning signal to each of the non-testing lines for a second duration, and the second duration of each of the non-testing lines corresponds to the response time parameter corresponding to the corresponding non-testing line that is stored in the memory.

6. The keyboard with wire aging self-adaption according to claim 1, wherein the return signal indicates that the corresponding return line and the scanning signal have a same logic level.

7. The keyboard with wire aging self-adaption according to claim 1, wherein in a scanning cycle, the processor executes several times of the scanning round, and in each of the scanning rounds of the scanning cycle, the scanning lines selected as the testing line are different from each other.

8. The keyboard with wire aging self-adaption according to claim 7, wherein the processor selects the testing line for each of the scanning rounds of the scanning cycle according to an arrangement order of the scanning lines.

9. The keyboard with wire aging self-adaption according to claim 1, wherein the processor detects conduction states of the switching elements in advance, and in response to the conduction state of any of the switching elements, the processor starts the scanning round.

10. The keyboard with wire aging self-adaption according to claim 1, wherein the first duration is maintained for a first time period, and according to the response time parameter corresponding to the testing line that is stored in the memory, the processor sets the first time period.

11. A self-adaption method for a keyboard, executed by a processor, wherein the keyboard comprises a scanning circuit, the scanning circuit comprises a plurality of scanning lines, a plurality of return lines, and a plurality of switching elements, and the switching elements are respectively coupled to intersections of the scanning lines and the return lines; the self-adaption method for keyboard comprises:

setting a parameter set, wherein the parameter set comprises a plurality of response time parameters of the scanning lines;

selecting at least one of the scanning lines as a testing line in a scanning round;

feeding a scanning signal to each of the scanning lines in turn by the processor in the scanning round;

in response to a conduction state of one of the switching elements coupled to the testing line, detecting a return signal on the corresponding return line by the processor;

in a first duration in which the testing line maintains the scanning signal, detecting a starting point of the first duration to a starting point of the return signal corresponding to the first duration to obtain a time difference; and according to the time difference and the response time parameter corresponding to the testing line that is stored in a memory, determining whether or not to update the response time parameter corresponding to the testing line that is stored in the memory.

12. The self-adaption method for the keyboard according to claim 11, wherein the step of according to the time difference and the response time parameter corresponding to the testing line that is stored in the memory, determining whether or not to update the response time parameter corresponding to the testing line that is stored in the memory further comprises:

in a condition that the time difference is greater than the response time parameter corresponding to the testing line that is stored in the memory, updating the response time parameter corresponding to the testing line that is stored in the memory with the time difference.

13. The self-adaption method for the keyboard according to claim 12, further comprises:

selecting at least two of the scanning lines as the testing lines to execute subsequent scanning rounds, until the scanning lines not being selected as the testing lines are selected as the testing line in a current scanning cycle.

14. The self-adaption method for the keyboard according to claim 11, wherein the step of according to the time difference and the response time parameter corresponding to the testing line that is stored in the memory, determining whether or not to update the response time parameter corresponding to the testing line that is stored in the memory further comprises:

in a condition that the time difference is less than or equal to the response time parameter corresponding to the testing line that is stored in the memory, not updating the response time parameter corresponding to the testing line that is stored in the memory.

15. The self-adaption method for the keyboard according to claim 11, wherein the scanning lines comprises the testing line and a plurality of non-testing lines, the processor maintains the scanning signal to each of the non-testing lines for a second duration, and the second duration of each of the non-testing lines corresponds to the response time parameter corresponding to the corresponding non-testing line that is stored in the memory.

16. The self-adaption method for the keyboard according to claim 11, wherein the return signal indicates that the corresponding return line and the scanning signal have a same logic level.

17. The self-adaption method for the keyboard according to claim 11, wherein in a scanning cycle, the processor executes several times of the scanning round, and in each of the scanning rounds of the scanning cycle, the scanning lines selected as the testing line are different from each other.

18. The self-adaption method for the keyboard according to claim 17, wherein the testing line is selected according to an arrangement order of the scanning lines.

19. The self-adaption method for the keyboard according to claim 11, further comprising:

detecting conduction states of the switching elements in advance and starting the scanning round in response to the conduction state of any of the switching elements.

20. The self-adaption method for the keyboard according to claim 11, wherein the first duration is maintained for a first time period, and according to the response time parameter corresponding to the testing line that is stored in the memory, the processor sets the first time period.

21. A non-transitory electronic computing device readable medium with a stored program, wherein when an electronic device with a processor loads and executes the stored program, the electronic computing device is capable of performing the self-adaption method for the keyboard according to claim 11.

22. A non-transitory electronic computing device program product with an electronic computing device program, wherein when an electronic computing device loads and executes the electronic computing device program, the electronic computing device is capable of performing the self-adaption method for the keyboard according to claim 11.

* * * * *